United States Patent [19]
Pierret

[11] Patent Number: 6,034,512
[45] Date of Patent: Mar. 7, 2000

[54] REGULATOR FOR A POLYPHASE MOTOR VEHICLE ALTERNATOR

[75] Inventor: Jean-Marie Pierret, Paris, France

[73] Assignee: Valeo Equipements Electriques Moteur, France

[21] Appl. No.: 09/220,671

[22] Filed: Dec. 24, 1998

[30] Foreign Application Priority Data

Dec. 24, 1997 [FR] France .................................. 97 16496

[51] Int. Cl.⁷ ............................. H02H 7/06; H02K 11/00
[52] U.S. Cl. ................................................. 322/99; 322/20
[58] Field of Search ................................ 322/20, 29, 99; 324/416

[56] References Cited

U.S. PATENT DOCUMENTS

| | | | |
|---|---|---|---|
| 4,061,932 | 12/1977 | Cordell .................................... | 307/360 |
| 5,285,146 | 2/1994 | Pierret et al. .............................. | 322/25 |
| 5,357,186 | 10/1994 | Pennisi et al. ............................. | 307/65 |
| 5,521,486 | 5/1996 | Takamoto et al. ......................... | 322/99 |
| 5,701,089 | 12/1997 | Perkins ..................................... | 322/99 |

FOREIGN PATENT DOCUMENTS

| | | |
|---|---|---|
| 2 343 255 | 9/1977 | France . |
| 2 678 070 | 12/1992 | France . |
| 2 730 359 | 8/1996 | France . |

OTHER PUBLICATIONS

French Search Report dated Sep. 2, 1998.

*Primary Examiner*—Nestor Ramirez
*Assistant Examiner*—Peter Medley
*Attorney, Agent, or Firm*—Morgan & Finnegan, LLP

[57] ABSTRACT

A regulator for a polyphase alternator for a motor vehicle, the regulator including detector means for detecting a voltage difference between the phase terminals of said alternator, which comprise at least one transistor circuit forming a current mirror whose two branches are connected at one end to respective ones of the two phase terminals and are connected at the other end to transistors forming current sources that supply said branches with currents of the same magnitude, those branches also having resistors of different resistances such that one of the transistors becomes non-conductive when a voltage difference in excess of a given threshold appears between the two phase terminals, said transistor becoming non-conductive giving rise to a change in the level of a logic output controlled by the voltage at a point on said branch between the current source transistor and the current mirror transistor.

12 Claims, 5 Drawing Sheets

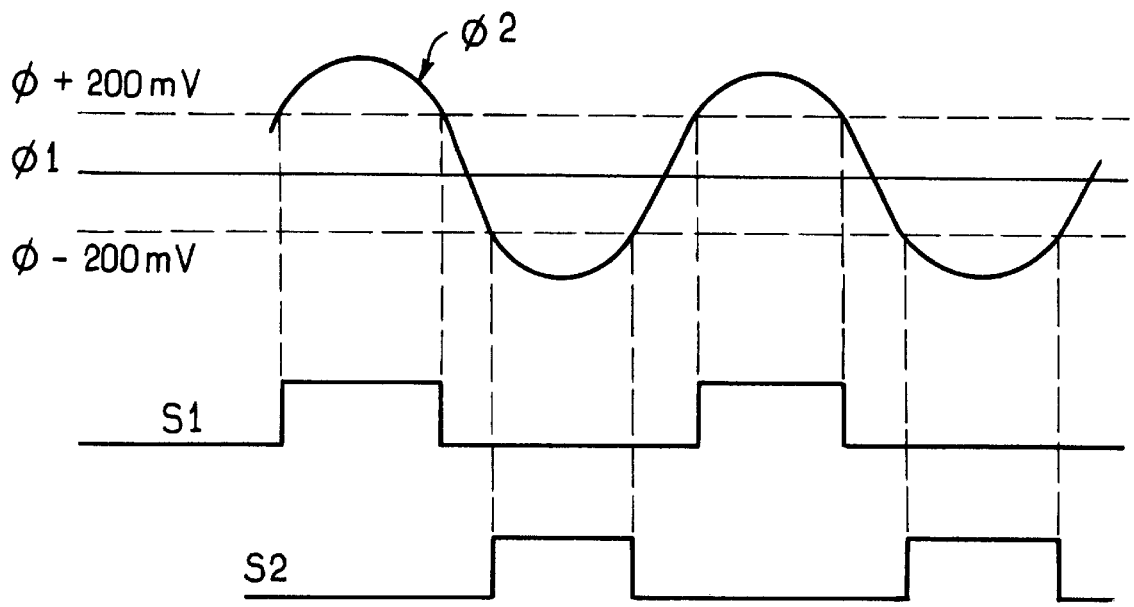
FIG._3
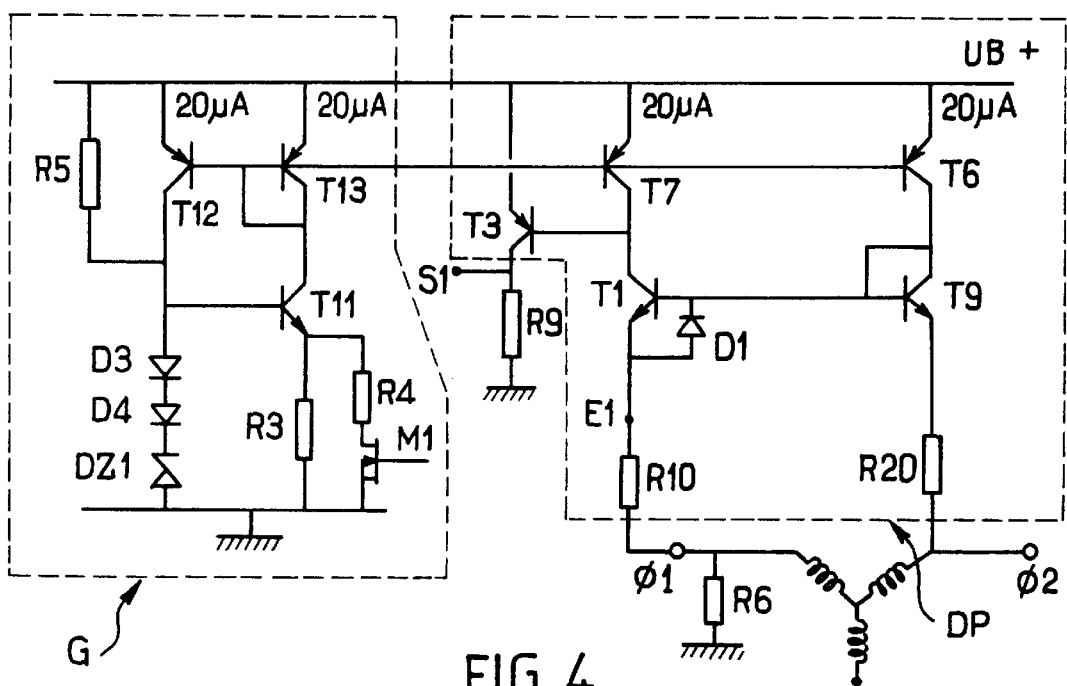
FIG._4

FIG_6

REGULATOR FOR A POLYPHASE MOTOR VEHICLE ALTERNATOR

The present invention relates to regulators for motor vehicle alternators.

BACKGROUND OF THE INVENTION

Accompanying FIG. 1 is a diagram of a conventional three-phase alternator circuit. The circuit comprises, in particular, three star-connected alternator secondary windings EN1, EN2, and EN3, a rectifier bridge P made up of three pairs of diodes, and a regulator R having two phase inputs φ1 and φ2 receiving two of the three phase voltages from the secondary windings EN1, EN2, and EN3.

Conventionally, the regulator R has a circuit DP for detecting the appearance of a voltage difference between the two phase terminals φ1 and φ2 when the alternator is caused to rotate, and for triggering regulation of the battery voltage when said rotation has been detected in this way. Such a circuit DP can be used for ensuring that the alternator is self-starting.

Numerous circuits for detecting a voltage difference between the phase terminals of an alternator are already known. By way of example, reference can advantageously be made in this respect to the following patents and patent applications: FR-2 343 255, FR 2 730 359, and FR-2 678 070.

The circuits described in FR-2 343 255 and FR-2 730 359 have the advantage of good detection sensitivity (in particular 50 mV).

However, the inventors have found it to be desirable, particularly when testing regulators during manufacture or prior to mounting, to be able to apply voltage levels to the phase inputs φ1 and φ2 that are different from the voltage levels that said inputs receive when the alternator is in operation, and in particular to be able to apply to said phase inputs, voltage levels that are highly negative.

In particular, in a patent application filed on the same day as the present application, the inventors propose integrating in a regulator means for detecting such a particular voltage level on at least one phase terminal and for triggering operation of the regulator in an accelerated mode when said voltage level is detected. Under such circumstances, and without any need to provide additional input pins on the regulator, a regulator is provided which can be tested by implementing a series of operations in an accelerated mode for testing the functions of said regulator (time delay on starting, progressive charging, etc.), which would otherwise take place, in normal operation of the regulator, over several seconds.

Unfortunately, the circuits described in FR-2 343 255 and FR-2 730 359 do not enable a voltage difference to be detected between their two inputs when both inputs are taken to voltages that are highly negative.

In the circuit described in FR-2 343 255, the transistors of the current sources become non-conductive when negative voltages are applied to both inputs of the circuit.

In the circuit described in FR-2 730 359, accuracy degrades seriously when the voltages of the inputs of the circuit go beyond alternator feed voltage values.

FR-2 678 070 discloses a detection circuit suitable for operating even when highly negative voltages are applied to said two phase inputs φ1 and φ2.

Nevertheless, that circuit can respond at best to a detection threshold level of 600 mV, i.e. a level which does not enable self-starting to occur in alternators rotating at low speed.

OBJECTS AND SUMMARY OF THE INVENTION

An object of the invention is thus to provide a detector circuit which is highly sensitive (200 mV or less, e.g. 50 mV) and which is also suitable for operating independently of the absolute voltage levels on the phase inputs, and in particular with voltage levels on the phase inputs that are highly negative (e.g. about 10 volts below ground).

To this end, the invention provides a regulator for a polyphase alternator for a motor vehicle, the regulator including detector means for detecting a voltage difference between phase terminals for receiving phase voltages from said alternator, wherein said detection means include at least one transistor circuit forming a current mirror whose two branches are connected at one end to a respective one of the two phase terminals and are powered via their other ends by respective transistors forming current sources which deliver currents of the same magnitude to said branches, the two branches also having resistors of different resistances such that one of the transistors of the circuits forming current sources is limited to a predetermined current when a voltage difference greater than a given threshold appears between the two phase terminals, said limit giving rise to a change in the level of a voltage-controlled logic output at a point of said branch between the transistor forming a current source and the transistor of the circuit forming a current mirror.

Such a regulator advantageously further includes the various following characteristics taken singly or in any feasible combination:

- it has two logic outputs, and said transistor circuits forming a current mirror and current sources are duplicated so as to give rise to the change in level at one or other of said logic outputs, depending on the sign of the voltage difference between the phase terminals;
- the threshold level at which detection can be performed by said means is 200 mV or less;
- the resistance in the circuit branch forming the current mirror whose voltage controls the logic output is equal to 20 kō, the resistance in the other branch being equal to 10 kō;
- the resistance in the circuit branch forming a current mirror whose voltage controls the logic output is equal to 10 kō, and the threshold detection level made possible by the detector means is about 50 mV;
- the resistance of the circuit branch forming a current mirror having a voltage that controls the logic output is equal to 5 kō, the resistance of the other branch being equal to 2.5 kō; and
- the resistance in the circuit branch forming the current mirror having a voltage that controls the logic output is equal to 2.5 kō, and the regulator includes means for changing the threshold level at which a voltage difference is detected between the phase terminals when the voltage received on said terminals exceeds a given value.

BRIEF DESCRIPTION OF THE DRAWINGS

Other characteristics and advantages of the invention appear further from the description. The description is purely illustrative and non-limiting and should be read with reference to the accompanying drawings, in which:

FIG. 3 shows an example of input and output signals in the FIG. 2 circuit when the alternator starts rotating;

FIG. 4 is a diagram of another possible circuit of the invention; and

MORE DETAILED DESCRIPTION

Figure 1:
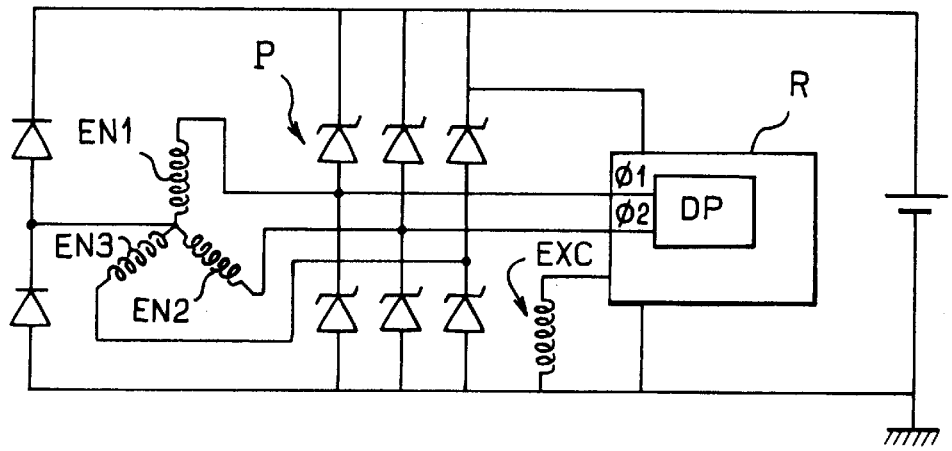
FIG. 1 is a diagram of a conventional three-phase alternator circuit.
Figure 2:
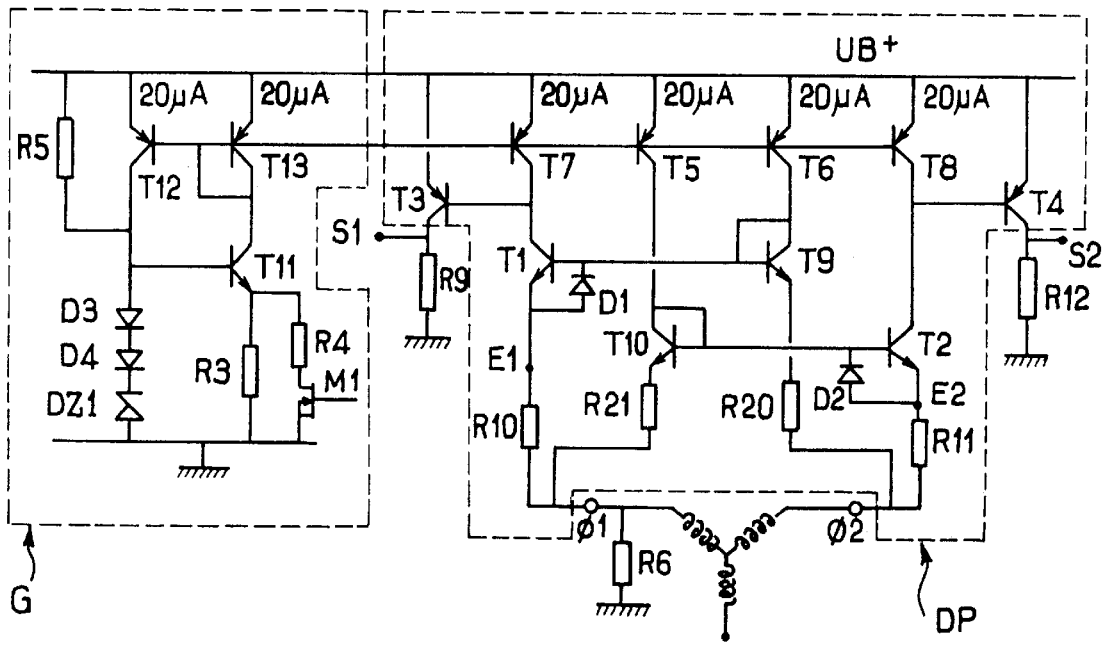
FIG. 2 is a diagram of a possible circuit for means for detecting the voltage difference between the phase terminals of a regulator, in accordance with a possible embodiment of the invention.

An example of the detection circuit DP constituting an embodiment of the invention and capable of operating with highly negative peak values (−10 volts relative to ground potential) is shown in FIG. 2.

The circuit comprises two current mirrors mounted between the terminals φ1 and φ2, one constituted by two NPN transistors T1 and T9, and the other by two NPN transistors T2 and T10.

More particularly, the terminal φ1 is connected via a resistor R10 to the emitter (point E1) of transistor T1 and via a resistor R21 to the emitter of transistor T10. Terminal φ2 is connected via a resistor R11 to the emitter of transistor T2 and via a resistor R20 to the emitter of transistor T9. The bases of the transistors T2 and T10 are connected together. The same applies to the bases of transistors T1 and T9.

The resistors R10 and R11 are of resistance greater than that of the resistors R20 and R21.

Respective diodes D1 and D2 are connected between the emitter and the base of each of transistors T1 and T2 to protect said transistors against their base-emitter junctions being reverse biased.

The collectors of transistors T1, T10, T9 and T2 are connected to the collectors of PNP transistors T7, T5, T6, and T8 whose bases are interconnected and whose emitters are connected to a power supply line at a voltage UB+, itself connected to the positive pole of the vehicle battery.

The circuit also has two logic output terminals S1 and S2.

The terminal S1 is connected to the collector of a PNP transistor T3 whose base is connected to the collectors of transistors T1 and T7. The emitter of transistor T3 is connected to the UB+line. The logic output terminal S1 is also connected to ground via a resistor R9. Similarly, the terminal S2 is connected to the collector of a PNP transistor T4 whose base is connected to the collectors of transistors T2 and T8 while its emitter is connected to the UB+ line. The logic output terminal S2 is itself connected to ground via a resistor R12.

It will be observed that the resistors R9 and R12 are not part of the detector proper: they serve as load resistors for the output stages of the detector as constituted by transistors T3 and T4.

The detector circuit shown in FIG. 2 also has a current generator G. The generator G comprises a high resistance resistor R5 connected between the UB+ line and the base of an NPN transistor T11. Said base of transistor T11 is connected to ground via two temperature-compensation diodes D3 and D4 connected in series with a zener diode DZ1. The emitter of transistor T11 is connected to ground via a resistor R3, and also via a subcircuit comprising a series-connection of a resistor R4 and a MOSFET transistor M1, with control thereof being explained in detail below.

The collector and the base of transistor T11 are connected respectively to the collectors of PNP type transistors T13 and T12 connected as a current mirror. The bases of transistors T13 and T12 are connected to the bases of transistors T5 to T8, while their emitters are connected to the UB+ line.

As will have been understood, this embodiment reproduces elements of the detector described in FR-2 678 070. In particular it reproduces transistors T1, T2, T3, T4 and resistors R10 and R11. Resistors R7 and R8 are replaced herein by transistors T7 and T8 operating as a current source.

Like the detector described in FR-2 678 070, the detector shown in FIG. 2 does not have a ground potential and the phase inputs φ1 and φ2 can have any value lower than the voltage UB+ without having any effect on the detection threshold level (200 mV or less).

The resistor R6 serves to bias the alternator secondary circuit when it is stationary. The resistance of the resistor R6 is large enough to avoid preventing a highly negative voltage being applied to the phase inputs φ1 and φ2 (−10 volts relative to ground).

The detector DP operates as follows: the transistor T11 delivers a current (20 μA) that is calibrated by the resistor R3 and the diodes D3, D4 and DZ1. The diodes D3 and D4 provide temperature compensation for the base-emitter junction of T11 and for the zener voltage of DZ1.

It is assumed that initially transistor M1 is open-circuit.

The current delivered by transistor T11 is copied with a scale factor of 1 (20 μA) by the transistors T12 and T5 to T8.

The currents from T5 and T6 (20 μA) pass through the transistors T9 and T10.

When the alternator is stationary, the two branches of the detector are in equilibrium since the voltage of phase φ2 is identical to the voltage of phase φ1. T1 copies the current in T9, and T2 copies the current in T10.

Nevertheless, since the resistance of resistors R10 and R11 is greater than that of resistors R20 and R21, the currents copied by T1 and T2 are less than the currents in T9 and T10. When the alternator is stationary, the current in T1 and T2 is about 12 μA while the current in T9 and T10 is 20 μA.

Consequently, the transistors T7 and T8 saturate and the transistors T3 and T4 are open-circuit. The outputs S1 and S2 of the detector are therefore taken to ground potential.

However, when the alternator is in rotation, the emf between φ1 and φ2 unbalances the two branches of the detector, and the currents in T1 and T2 are no longer fixed at 12 μA. If the voltage of φ1 is smaller than the voltage of φ2, then the current in R10 and T1 increases and becomes greater than 20 μA. Transistor T7 becomes unsaturated and the base of T3 is powered. T3 then conducts and the voltage of S1 becomes positive relative to ground. Similarly, if the voltage of φ2 decreases relative to the voltage of φ1, then the current in T2 exceeds 20 μA and the voltage of S2 becomes positive relative to ground.

FIG. 3 shows how the voltage on outputs S1 and S2 varies when the voltage of φ2 varies in sinusoidal manner relative to φ1. This corresponds to the emf produced by the remanence of the primary magnetic circuit when the alternator begins to rotate.

The level at which a voltage difference between the terminals φ2 and φ1 is detected is preferably 200 mV or less. This 200 mV detection level between the phases enables the alternator to be self-starting at low speeds of rotation (<1000 revolutions per minute (rpm)) without needing an initial excitation current.

It is shown that a detection threshold of 200 mV is obtained for the resistors R10 and R11 being selected to have a resistance of 20 kō and for the resistors R21 and R20 being selected to have a resistance of 10 kō.

In particular, with voltage detectors of the type described above, at the moment of detection:

$V_{BE}(T1)=V_{BE}(T9)$ and $V_{BE}(T2)=V_{BE}(T10)$ where $V_{BE}(T1)$, $V_{BE}(T2)$, $V_{BE}(T9)$, and $V_{BE}(T10)$ are the base-emitter junction voltages of T1, T2, T9, and T10.

Since the bases of T1 and T9 are connected together, the voltages of the emitters of T1 and T9 are identical at the moment of detection, since at that instant, the currents flowing through T1 and T9 are identical (20 µA); the same applies to T2 and T10 (there remains a residual offset of 2 mV to 3 mV known as the "offset" voltage).

It is therefore possible to reduce the resistances of resistors R10, R11, R20, and R21 very considerably so as to reduce the detection threshold level considerably. If it is desired to detect a voltage difference of 50 mV between φ1 and φ2, it is possible to adopt the following values:

R21=R20=2.5 kō

R10=R11=5 kō

In a variant, it is possible to determine resistances for R10 and R11 so that the emitters of T9 and T10 are connected directly to φ2 and φ1, respectively.

For a detection threshold level of 200 mV, then:

R10=R11=10 kō

For a detection threshold level of 50 mV, then:

R10=R11=2.5 kō

In practice, it is preferable to conserve resistors R20 and R21 when it is necessary to protect the transistors T9 and T10 against voltage surges passing via the phase inputs φ1 and φ2.

In general, and for source currents determined by T7, T5, T6, and T8, the detection threshold level depends on the difference between the resistance of resistors R10 and R20 on the one hand, and of R11 and R21 on the other hand, i.e.:

for a detection threshold level of 200 mV, then:

R10−R20=R11−R21=10 kō for a detection threshold level of 50 mV, then:

R10−R20=R11−R21=2.5 kō

It can be seen that the detection threshold level is proportional to the difference between the resistances of resistors R10−R20 (when the voltage of φ1 decreases relative to the voltage of φ2) and that the detection threshold level is proportional to the difference between the resistances of resistors R11−R21 (when the voltage φ2 decreases relative to the voltage of φ1).

FIG. 4 shows a simplified variant of the phase signal detector when it is desired to detect a half-cycle of one sign only. In this embodiment, the detector has only one current mirror (T1, T9) and only one logic output (S1, controlled by transistor T3). With this embodiment, a voltage difference is detected only when φ1<φ2.

By detecting a voltage difference between phases with a detection threshold level of about 50 mV to 200 mV, it is possible for the alternator to be self-starting at a low speed of rotation (<1000 rpm) without any need for an initial excitation current.

Figure 5:
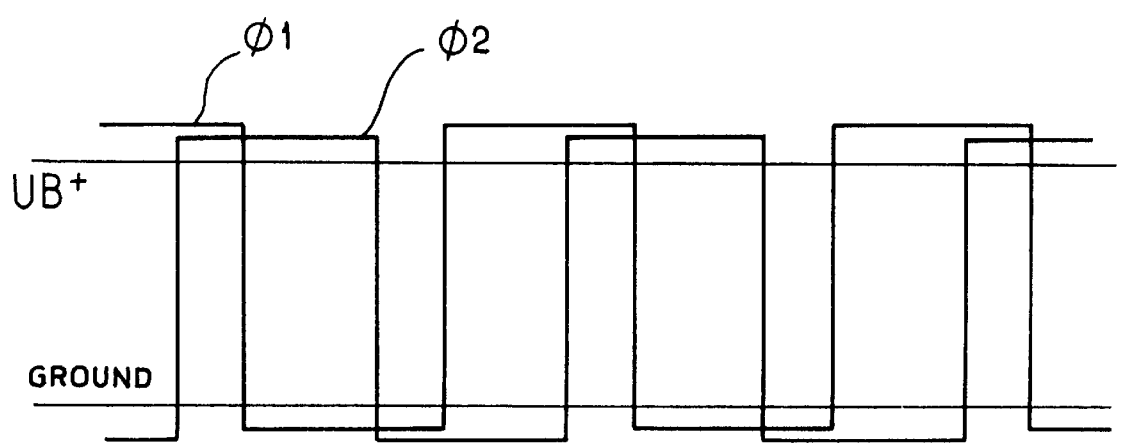
FIG. 5 is a graph showing the phase signals output by the secondary windings of the alternator when the regulator is under load

Nevertheless, such sensitivity can give rise to poor shaping of the output phase signals S1 and S2 when the alternator is delivering electricity. Under such circumstances, the emf between φ1 and φ2 is no longer a sinewave, but, as shown in FIG. 5, it is rectangular. In particular, when the two negative rectifier diodes connected to φ1 and φ2 are both conductive simultaneously, the voltage difference between φ1 and φ2 is theoretically zero. In practice, dispersions in diode characteristics and variations in the currents passed by such diodes mean that variations of 200 mV can occur between φ1 and φ2 within the zone where the voltage difference between φ1 and φ2 is theoretically zero. The resulting signals obtained at S1 and S2 do not correspond to switching fronts of the diodes, so it is no longer possible to measure the period of the phase signals.

The solution consists in increasing the detection level when the emf between φ1 and φ2 is high while remaining below any possibility of charging: for example, the detection threshold level can go from 50 mV or 200 mV to 800 mV when the emf between the phases exceeds 7 volts. This measurement of emf can be performed by the phase signal regulator circuit already in use in many so-called "multifunction" regulators.

The current generator G makes it possible to perform this change in detection threshold level. When the regulator detects an amplitude between phase signals greater than 7 volts, it causes the transistor M1 to conduct, such that the resistor R4 is connected in parallel with R3. Consequently, an increase in current through T11, T5, T6, T7, and T8 gives rise to the looked-for increase in detection threshold level: a detection threshold level of 800 mV is obtained for currents of 100 µA in T11, T7, T5, T6, and T8.

Figure 6:
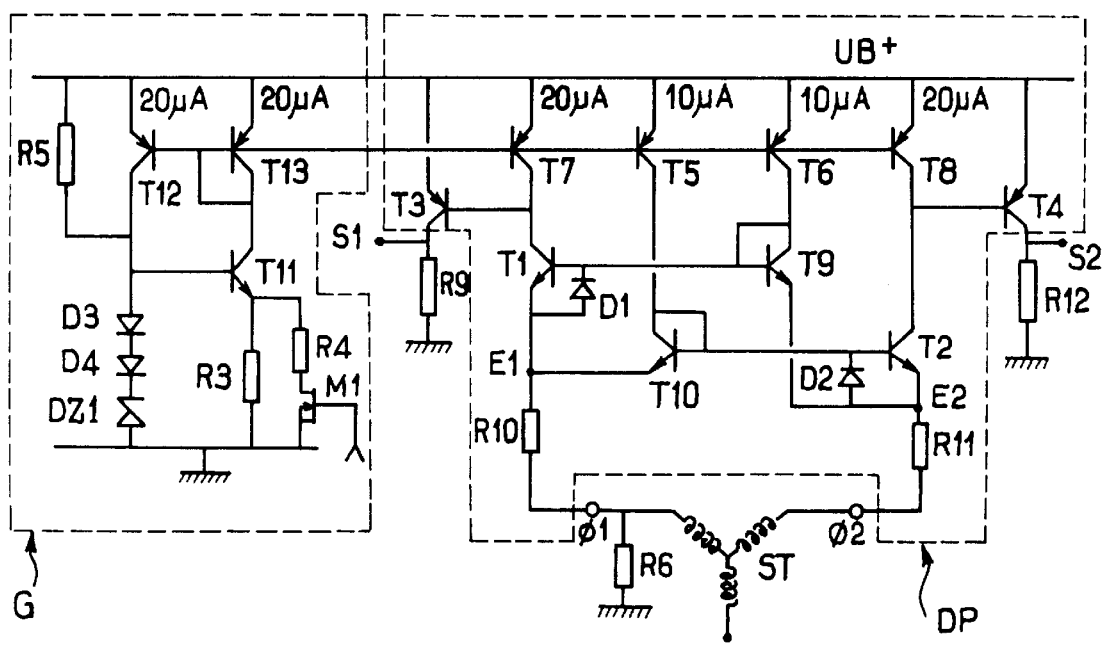
FIG. 6 is a diagram of an other possible circuit for means for detecting the voltage difference between the phase terminals of a regulator

Other embodiments of the invention can be envisaged. In particular, the regulator can be of the type as shown on FIG. 6, where the current delivered by transistor 11 is copied with a scale factor of 1 (20 µA) by the transistors T12, T7 and T8 and with a scale factor of ½ (10 µA) by the transistors T5 and T6. The main difference between this embodiment and the one decribed by reference to FIG. 2 is that the emitters of T9 and T10 are directly connected to points E1 and E2 (the resistors R20 and R21 are not used in this embodiment). A detector sensitivity of 200 mV is obtained with R10 and R11 chosen equal to 10 kΩ. However, the sensitivity threshold can be brought.

Further, the regulators proposed advantageously comprise a circuit ACC which responds to at least one terminal of the regulator to detect a signal level corresponding to that for triggering operation of the regulator in accelerated mode.

Figure 7:
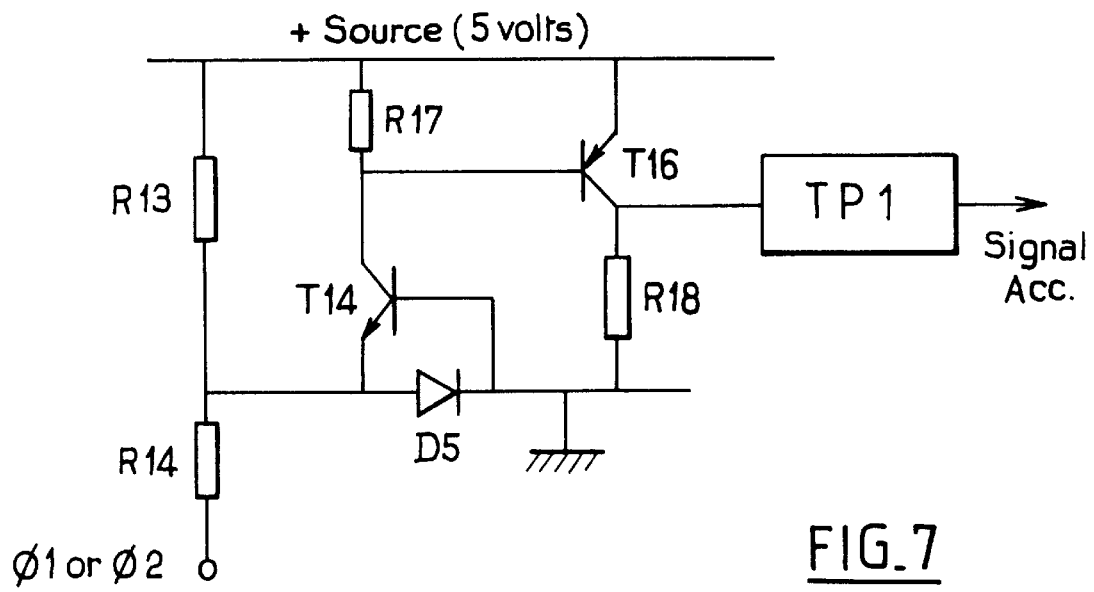
FIGS. 7 and 8 are diagrams of possible circuits for the voltage level detector means which trigger accelerated mode operation.

FIG. 7 shows an example of one possible embodiment for the circuit ACC. The circuit shown in this example has time delay means TP1 which are activated by one of the terminals φ1 or φ2 receiving a voltage that is below a given threshold relative to ground.

To this end, potential divider means are interposed between said input terminals and the time delay means TP1. These potential divider means are constituted by two resistors R13 and R14, whose common point is connected to the emitter of an NPN transistor T14 whose base is connected to ground and whose collector is connected via a resistor R17 to a power supply line at +5 volts. The resistor R13 is connected between said line and said emitter. The resistor R14 is connected between said emitter and one of the terminals φ1 and φ2.

A diode D5 is connected between said emitter and ground to protect the base-emitter junction of T14.

A PNP transistor T16 is connected between the power line and ground. More precisely, the base of the transistor T16 is controlled by the collector of transistor T14; its emitter is connected to the power supply line; its collector is connected to ground via a resistor R18. Its collector voltage is also injected to the input of the time delay means TP1.

The potential divider R13-R14 causes the transistor T14 to conduct and thus the transistor T16 to conduct when the voltage of the phase φ1 or φ2 crosses a predetermined level (e.g. −5 volts).

The time delay means TP1 store the signal for switching to accelerated mode, at least until the following half-cycle of φ1 or φ2.

Figure 8:
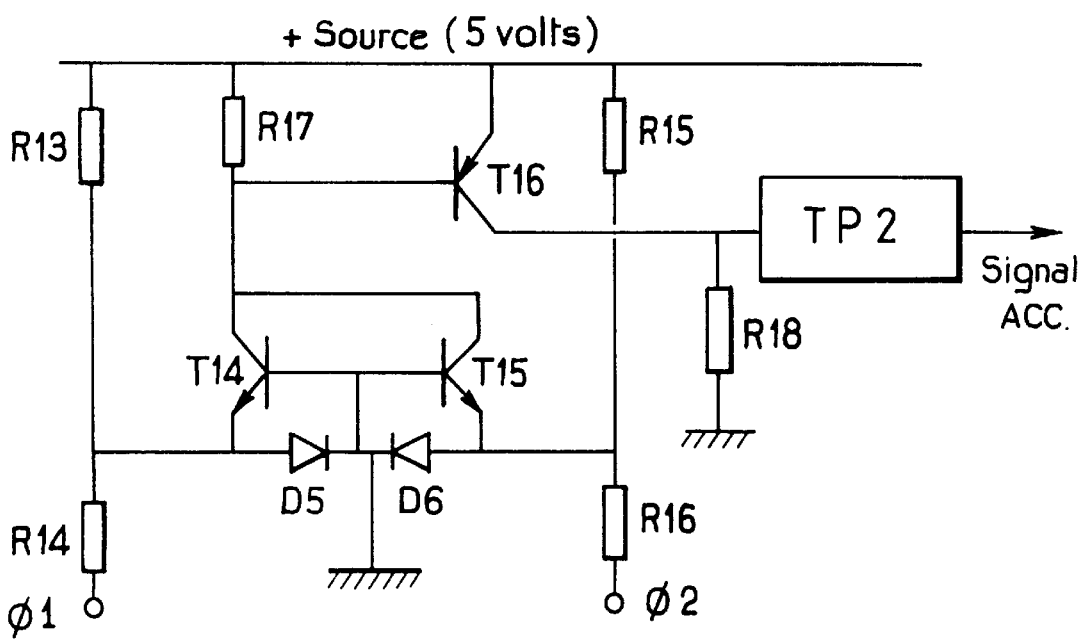

Another possible embodiment is shown in FIG. 8. In this example, a time delay TP2 is controlled by the voltage level on either of the two phase inputs φ1 and φ2. To this end, the potential divider R13-R14 and the transistor T14 controlling the transistor T16 are duplicated by a second potential divider R15-R16 and a second transistor T15. Diodes D5 and D6 protect the base-emitter junctions of the transistors T14 and T15 against reverse bias.

Thus, the time delay which switches on accelerated mode operator is triggered when the voltage on φ1 or the voltage on φ2 passes beneath the above-mentioned threshold (−5 volts, for example). If the signals applied to φ1 and φ2 are in accurate phase opposition (which can easily be achieved during testing), then the time delay TP2 can easily be short.

Naturally, this mode of operation as triggered by highly negative voltages on the terminals φ1 and φ2 cannot occur on a regulator connected to an alternator since the rectifier bridge P prevents the voltage on φ1 or on φ2 going beyond −1 volts.

Operation in accelerated mode can be obtained only during testing of the regulator on its own or mounted on a brush holder.

I claim:

1. A regulator for a polyphase alternator for a motor vehicle, the regulator including detector means for detecting a voltage difference between phase terminals for receiving phase voltages from said alternator, wherein said detection means include at least one transistor circuit forming a current mirror whose two branches are connected at one end to respective ones of the two phase terminals and are powered via their other ends by transistors forming current sources which deliver currents of the same magnitude to said branches, the two branches also having resistors of different resistances such that one of the transistors of the circuits forming current sources is limited to a predetermined current when a voltage difference greater than a given threshold appears between the two phase terminals, said limit giving rise to a change in the level of a voltage-controlled logic output at a point of said branch between the transistor forming a current source and the transistor of the circuit forming a current mirror.

2. A regulator according to claim 1, including two logic outputs, and wherein said transistor circuits forming a current mirror and current sources are duplicated so as to give rise to the change in level at one or other of said logic outputs, depending on the sign of the voltage difference between the phase terminals.

3. A regulator according to claim 1, wherein the threshold level at which voltage difference between the phases is detected is associated with the difference between the resistances of the resistors of the detector means.

4. A regulator according to claim 1, wherein the threshold level for detecting voltage difference between the phases is proportional to the difference between the resistances of the resistors of the detector means.

5. A regulator according to claim 1, wherein the detector means comprise a single current mirror and a single logic output so as to detect a voltage difference of one sign only between φ1 and φ2.

6. A regulator according to claim 1, wherein the threshold level at which detection can be performed by said means is 200 mV or less.

7. A regulator according to claim 6, wherein the resistance in the circuit branch forming the current mirror whose voltage controls the logic output is equal to 20 kō, the resistance in the other branch being equal to 10 kō.

8. A regulator according to claim 6, wherein the resistance in the circuit branch forming a current mirror whose voltage controls the logic output is equal to 10 kō.

9. A regulator according to claim 1, wherein the threshold detection level made possible by the detector means is about 50 mV.

10. A regulator according to claim 9, wherein the resistance of the circuit branch forming a current mirror having a voltage that controls the logic output is equal to 5 kō, the resistance of the other branch being equal to 2.5 kō.

11. A regulator according to claim 9, wherein the resistance in the circuit branch forming the current mirror having a voltage that controls the logic output is equal to 2.5 kō.

12. A regulator according to claim 1, including means for changing the threshold level at which a voltage difference is detected between the phase terminals when the voltage received on said terminals exceeds a given value.

* * * * *